United States Patent
Meyer

(10) Patent No.: US 7,109,787 B2
(45) Date of Patent: Sep. 19, 2006

(54) HIGH-EFFICIENCY CIRCUIT FOR DEMODULATING CARRIERS IN QUADRATURE

(75) Inventor: Jacques Meyer, Saint Martin le Vinoux (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/389,508

(22) Filed: Mar. 14, 2003

(65) Prior Publication Data

US 2003/0174016 A1 Sep. 18, 2003

(30) Foreign Application Priority Data

Mar. 15, 2002 (FR) .................................... 02 03256

(51) Int. Cl.
*H04L 27/22* (2006.01)
(52) U.S. Cl. ...................... 329/304; 329/308; 329/309; 375/340; 375/324; 375/331; 375/329; 375/345
(58) Field of Classification Search ................ 329/304, 329/309, 308; 375/340, 324, 331, 329, 345
See application file for complete search history.

(56) References Cited

U.S. PATENT DOCUMENTS

| | | | |
|---|---|---|---|
| 5,440,587 A | | 8/1995 | Ishikawa et al. |
| 5,550,869 A | * | 8/1996 | Gurantz et al. ............. 375/340 |
| 5,604,929 A | | 2/1997 | Loper et al. |
| 5,705,949 A | * | 1/1998 | Alelyunas et al. .......... 329/304 |
| 6,034,564 A | | 3/2000 | Iwamatsu |
| 6,310,513 B1 | | 10/2001 | Iemura |

FOREIGN PATENT DOCUMENTS

JP 406284159 A * 10/1994

OTHER PUBLICATIONS

Jou et al. "Design of Carrier Recovery for QAM/VSB dual Mode" IEEE International Conference on Communications vol. 2, Jun. 29, 2002 pp. 1535-1539.*
Horn "Basic Electronics Theory" 4th Edition, TAB Books, 1994 pp. 336-337.*
French Search Report from French Patent Application 02/03256, filed Mar. 15, 2002.

* cited by examiner

*Primary Examiner*—Michael B Shingleton
(74) *Attorney, Agent, or Firm*—Lisa K. Jorgenson; James H. Morris; Wolf, Greenfield & Sacks, P.C.

(57) ABSTRACT

A demodulation circuit for demodulating a received signal including carriers in quadrature modulated by digital signals and/or in which the processing is performed on two carriers in quadrature. The circuit includes a demodulator, an analog-to-digital converter, a correcting circuit, and a derotator. The correcting circuit provides signals to the derotator based on the derotator output signals and on signals provided by the analog-to-digital converter.

9 Claims, 4 Drawing Sheets

HIGH-EFFICIENCY CIRCUIT FOR DEMODULATING CARRIERS IN QUADRATURE

BACKGROUND OF THE INVENTION

1. Field of the Invention

The present invention relates to the transmission of digital signals and in particular to the demodulation of carriers in quadrature modulated by digital signals or the like.

2. Discussion of the Related Art

FIG. 1 illustrates the principle of a modulation of 4-QAM type. "QAM>>" means "quadrature amplitude modulation". In the 4-QAM modulation, two digital signals X(t) and Y(t) can each take two digital values, here represented by values −1 and +1. In FIG. 1, signal X(t) is shown on the abscissa and signal Y(t) is shown on the ordinate. Signal X(t) modulates a carrier $\cos(\omega t)$ and signal Y(t) modulates a carrier in quadrature, $\cos(\omega t+\pi/2)$. The transmitted signal S(t) is equal to:

$$X(t) \cdot \cos \omega t + Y(t) \cdot \cos(\omega t+\pi/2) = X(t) \cdot \cos \omega t - Y(t) \cdot \sin \omega t.$$

Each couple (X,Y) in plane X,Y represents a point Mi of a constellation. In 4-QAM, the constellation is formed of four points M1, M2, M3, and M4, for example corresponding to digital values 00, 01, 11, and 10.

X(t) and Y(t) may exhibit more than two discrete levels. For example, in 16-QAM modulation, each signal X(t) and Y(t) may have four discrete levels, and the constellation comprises 16 points. The number of points in a constellation can be quite high. For example, in 2,048-QAM modulation, there are 2,048 points in the constellation.

FIG. 2 shows the well-known principle of a demodulation of signal S(t)=X(t)·cos ωt−Y(t)·sin ωt. The processing of signal S(t) is performed in two parallel branches. In a first branch, signal S(t) is multiplied in a multiplier 2 by a signal f1=cos(ωt). The output of multiplier 2 comprises signal X(t), in baseband, and a pulse component 2ω. The output of multiplier 2 drives a low-pass filter 4 intended to suppress pulse component 2ω. At the output of filter 4, which is assumed to be perfect, is a signal corresponding to the transmitted signal X(t).

In a second branch, said to be in quadrature, signal S(t) undergoes a multiplication by a signal f2=sin(ωt) in a multiplier 2'. The output of multiplier 2' drives a low-pass filter 4' intended to suppress pulse component 2ω from the signal. If the demodulation has been perfect, the output of filter 4' provides a signal corresponding to the transmitted signal Y(t).

Generally, there exists a phase ambiguity on the carrier, and the output signals of filters 4 and 4' must undergo a rotation in a derotator, which results in rotating the received constellation around its center 0 to have it correspond to the transmitted constellation.

Many problems are posed in the forming of demodulation circuits. Indeed, especially when frequency ω/2π of the carriers is high, as in satellite or cable transmission, where the RF frequencies of the modulated carriers are respectively on the order of approximately from 1 to 2 GHz and from 70 to 900 MHz, various errors may make the demodulators inoperative. These errors may come from different sources.

On the one hand, it is difficult to have the frequency of signals f1 and f2 used in the demodulation strictly identical to frequency ω/2π of the carriers. Indeed, due to technological dispersions or to the precision with which a frequency can be obtained, the frequency of signals f1 and f2 actually is f'=ω'/2π, with ω' different from ω. This results in a pulse difference ω'−ω, which translates as an error in the demodulation of signal S(t).

On the other hand, it is difficult to obtain signals f1 and f2 which are strictly in phase quadrature. Thus, instead of having signals f1 and f2 respectively equal to cos ωt and sin ωt, signals f1 and f2 are equal to cosωt and sin(ωt+ε). The resulting phase quadrature error ε, which is all the more difficult to control as the variation range of frequency RF is large, introduces an additional error which must be compensated for. For example, in a signal modulator transmitted by satellite, error ε can be at most from 2 to 3 degrees. In a decoder for cable-transmitted signals, for example, by means of a 256-QAM modulation, the maximum error on phase quadrature ε must be smaller than 0.5 degrees.

A third type of error results from the gain difference existing between the two demodulation circuit branches. This error, indifferently called the gain or amplitude error, generates the same unwanted effects as quadrature and frequency errors.

FIG. 3 shows a demodulation circuit according to prior art, in which these problems are solved by the use of a digital demodulator.

In FIG. 3, a received signal RF corresponding to above signal S(t) undergoes a first frequency change in a frequency change unit 10. This frequency change is carried out by means of a variable frequency F1 enabling transposing, after filtering, frequency ω/2π of the input signal into a set intermediary frequency IF1. Frequency signal IF1 arrives on a second frequency change unit 12, driven by a frequency signal F2. Unit 12 provides an intermediary frequency signal IF2. Intermediary frequency IF2 is sufficiently low to enable sampling of the signal. For example, frequency IF2 is 36 MHz. The output signal of unit 12 arrives on an integrated circuit 14. Integrated circuit 14 includes an analog-to-digital converter 16, which converts intermediary frequency signal IF2 into a sequence of digital samples. These samples arrive on a demodulator 18. Demodulator 18 is a digital demodulator. It is driven by two signals f1 and f2 respectively equal to cos ωt and sin ωt. Due to the fact that signals f1 and f2 are digital signals, they can be obtained with the desired precision. Indeed, a phase or frequency difference between signals f1 and f2 can be simply corrected by the addition of additional bits or a modification of the bits defining these signals. Demodulator 18 provides two baseband signals X' and Y' which are sent to a derotator 19 providing signals X(t) and Y(t) corresponding to the transmitted signals. The output of derotator 19 forms the output of integrated circuit 14.

The circuit of FIG. 3 has the disadvantage of not being totally implementable as a single integrated circuit. Indeed, the analog-to-digital conversion of the signal before demodulation implies several frequency changes of signal RF, to lower its frequency. The frequency changes, which are analog, require very selective filters to reject unwanted image frequencies. These filters, generally surface wave filters, cannot be integrated. They are expensive and bulky. This results in many cost and bulk disadvantages. Further, the prior art solution goes against the present technological tendency, which heads towards an always-increasing integration, for example, in CMOS technology.

SUMMARY OF THE INVENTION

An object of the present invention is to provide a demodulator of carriers in quadrature modulated by digital signals which is totally integrable.

Another object of the present invention is to provide such a demodulator that can be implemented in CMOS technology.

Another object of the present invention is to provide such a demodulator that uses no sophisticated bandpass filters.

To achieve these and other objects, the present invention provides a demodulation circuit for demodulating a received signal comprising carriers in quadrature modulated by digital signals and/or in which the processing is performed on two carriers in quadrature, comprising:

a demodulator for demodulating the received signal and providing first signals substantially in baseband, an analog-to-digital converting means coupled to the demodulator for providing second signals based on the first signals, a correcting circuit coupled to the analog-to-digital converter for providing third signals, and a derotator coupled to the correcting circuit for providing output signals based on the third signals, the correcting circuit providing the third signals based on the second signals and on the output signals.

According to an embodiment of the present invention, the correcting circuit comprises:

a decision unit receiving the output signals and providing fourth signals assumed to correspond to non-erroneous output signals, a first adder receiving the output signals and the fourth signals and providing fifth signals corresponding to the differences between the output signals and the fourth signals, a first calculation unit coupled to the decision unit and to the first adder and providing a linear combination of the fourth and fifth signals, and a rotation unit for rotating the signals provided by the first calculation unit.

According to an embodiment of the present invention, the correcting circuit comprises an amplifier coupled with the rotation unit and an integrator coupled with the amplifier.

According to an embodiment of the present invention, the second signals comprise a first second signal and a second second signal, and the correcting circuit comprises:

a first multiplier receiving the first second signal and providing a value proportional to the first second signal, a second multiplier receiving the second second signal and providing a value proportional to the second second signal, and a second adder providing a corrected second second signal equal to the difference of the second second signal and of said value proportional to the first second signal, decreased by said value proportional to the second second signal.

According to an embodiment of the present invention, the circuit comprises a control unit coupled to the derotator for providing a rotation angle to the derotator.

According to an embodiment of the present invention, the circuit comprises a delay unit coupled to the control unit and to the rotation unit for delaying the rotation angle provided by the control unit.

The present invention also provides a method for demodulating carriers in quadrature modulated by two digital signals X(t) and Y(t), comprising:

a) demodulating the carriers to obtain two first signals substantially in baseband, b) submitting the first signals to a rotation in a derotator to obtain second frequency-corrected signals, and c) correcting the first signals by means of the second signals, so that gain and quadrature errors introduced in the demodulation are corrected.

According to an embodiment of the present invention, step a) of demodulation is carried out on analog signals and rotation and corrections steps b) and c) are carried out on digital signals.

The foregoing objects, features and advantages of the present invention will be discussed in detail in the following non-limiting description of specific embodiments in connection with the accompanying drawings.

DETAILED DESCRIPTION

Figure 1:
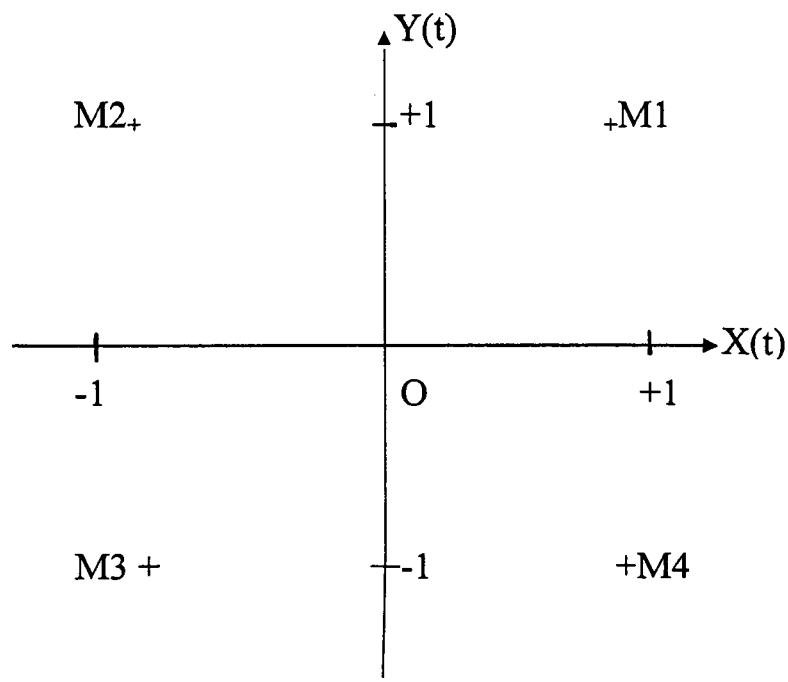
FIG. 1, previously described, illustrates the principle of a 4-QAM demodulation.
Figure 2:
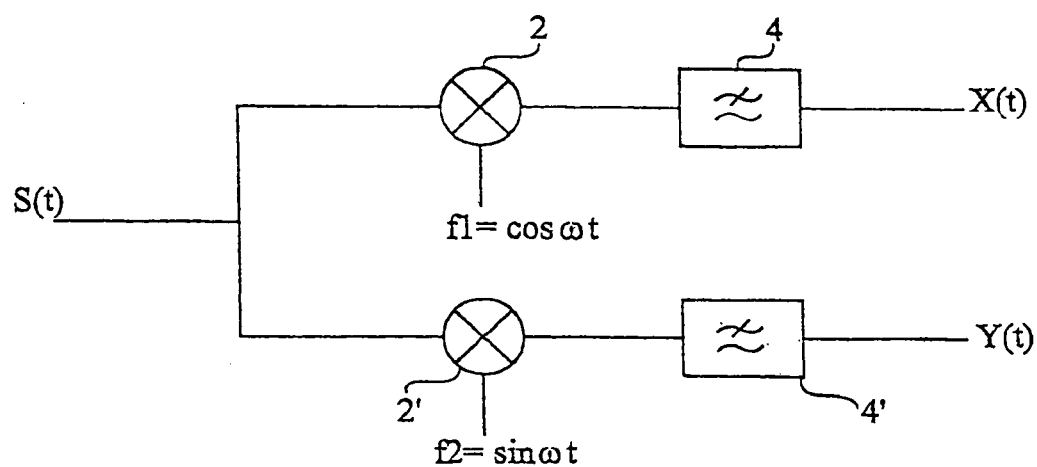
FIG. 2, previously described, illustrates the principle of a demodulation of carriers in quadrature.
Figure 3:
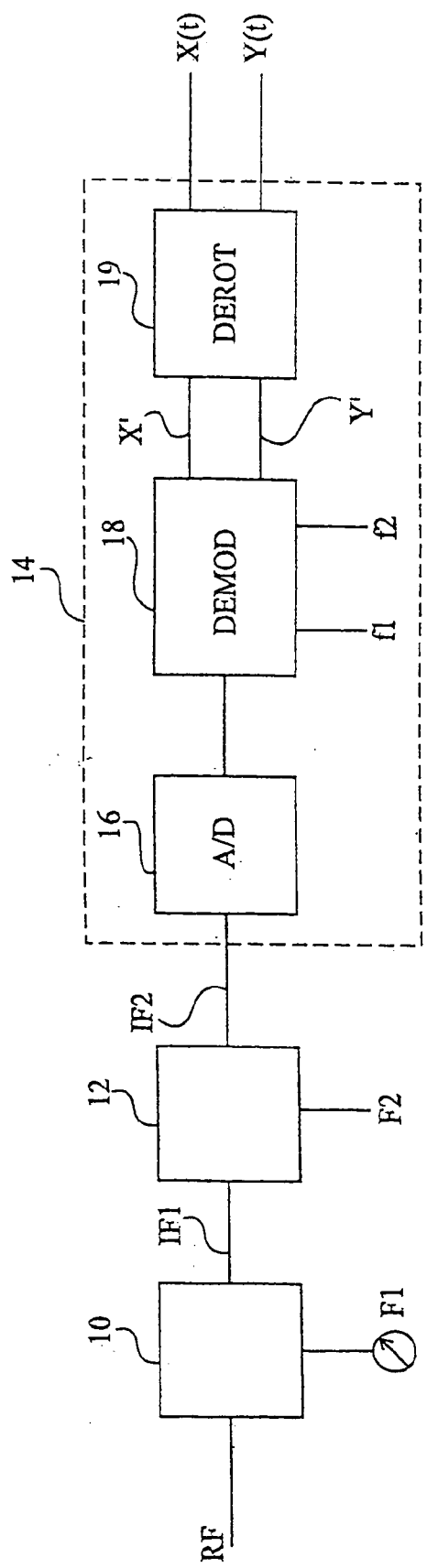
FIG. 3, previously described, shows a demodulation circuit according to prior art.
Figure 4:
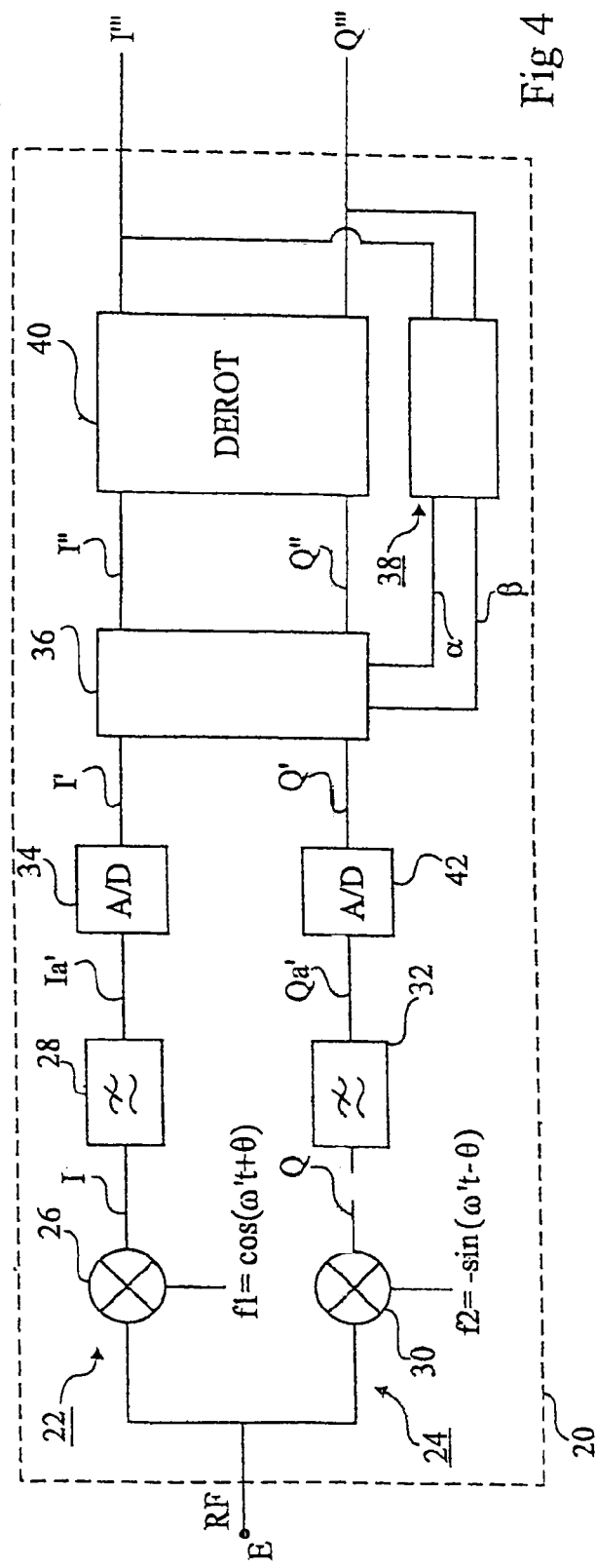
FIG. 4 illustrates the principle of a demodulation circuit according to the present invention.

FIG. 4 illustrates the principle of a circuit according to the present invention. An integrated circuit 20 receives on an input terminal E a signal RF expressed as S(t)=X(t). cos (ωt)−Y(t). sin(ωt). Input E is connected to two branches 22 and 24 of the circuit, that may respectively be called the in-phase (22) and in-quadrature (24) branches.

In branch 22, signal RF reaches a frequency changer (or multiplier) 26, where the input signal is multiplied by a signal f1=cos(ω't+θ). Pulse ω' of signal f1 is chosen to be as close as possible to pulse ω. In practice, ω' is slightly different from ω and difference ω−ω' will be called Δ. Angle θ corresponds, as will be seen hereafter, to a phase quadrature error. Multiplier 26 provides a signal I which, after filtering in a low-pass filter 28, becomes a signal I'a. Filter 28 suppresses the pulse components ω+ω' of signal I.

Branch 24 comprises a frequency changer 30 which multiplies signal RF by a signal f2=−sin(ω't−θ). Multiplier 30 provides a signal Q which is sent to a low-pass filter 32 in that suppresses the pulse component ω+ω' of signal Q. Low-pass filter 32 provides a signal Q'a.

Signals I'a and Q'a respectively provided by filters 28 and 32 are substantially in baseband.

Assuming that the quadrature error is equal to 2θ, that the gain error between branches is 2a, and that these errors are equally distributed on the two branches, the expressions of I, Q, I'a, and Q'a are the following:

$$I=(1+a).[X\cos(\omega t)-Y\sin(\omega t)].\cos(\omega' t+\theta) \quad (1)$$

$$Q=-(1-a).[X\cos(\omega t)-Y\sin(\omega t)].\sin(\omega' t-\theta) \quad (2)$$

$$I'a=(1+a)[X\cos(\Delta t-\theta)-Y\sin(\Delta t-\theta)] \quad (3)$$

$$Q'a=(1-a).[X\sin(\Delta t+\theta)+Y\cos(\Delta t+\theta)] \quad (4)$$

In branch 22, the output of filter 28 is sent to an analog-to-digital converter 34 which provides a signal I' corresponding to digitized signal I'a. Signal I' is sent to a unit 36. Unit 36 receives various other signals which will be seen hereafter, among which a correction signal α and a correction signal β provided by a feedback loop 38. An output of unit 36 provides a signal I" which corresponds to signal I' once corrected. Signal I" is sent to a derotator 40.

In branch 24, low-pass filter 32 is sent to an analog-to-digital converter 42. Analog-to-digital converter 42 provides a signal Q' corresponding to signal Q'a once digitized. Signal Q' is sent to unit 36, an output of which provides a signal Q" which corresponds to signal Q' once corrected. Signal Q" is sent to derotator 40.

Derotator 40 provides two signals I''' and Q'''. When the control by loop 38 is stabilized and the derotator angle is correct, signal I''' corresponds to transmitted signal X(t) and signal Q''' corresponds to transmitted signal Y(t).

It should be noted that derotator 40 may be followed by other elements, such as filters, directors, etc. or by controlled-gain amplifiers (CGA).

Thus, according to the present invention, analog signal RF is directly demodulated to provide signals I'a and Q'a substantially in baseband. The demodulator uses no sophisticated filters such as surface wave filters, and it can easily be totally integrated. It may, for example, be formed with CMOS technology transistors, and takes up less space. Signals I'a and Q'a which are sent to the analog-to-digital converters are signals which, in specific uses such as cable or satellite transmission, do not correspond to the required specifications, a correction being subsequently performed by means of the circuit feedback loop. This architecture provides significant advantages.

Thus, while, in prior art, the gain difference between branches must be on the order of 1 decibel in satellite transmission, the circuit of the present invention accepts gain differences ranging to two decibels with a correct operation. In the case of cable transmission, where the gain differences must be on the order of from 0.1 to 0.2 decibel in prior art, the circuit according to the present invention provides satisfactory results with gain differences ten times as large, on the order of from 1 to 2 decibels.

As concerns quadrature error 2θ, errors from 5 to 10° can be accepted due to the present invention with no problem, even in the case of cable transmission where, as it should be reminded, the tolerance is very small (0.5°).

As said, in the present invention, the demodulation of the RF signal is performed in an analog manner with no specific care. The error correction is performed digitally by means of the feedback loop of the circuit which receives output signals I''' and Q''' of the demodulation circuit. Indeed, as will be shown by the following mathematical study, it is possible to deduce the gain and quadrature errors between branches from the output signals, and to modify the signals processed by each of the branches by means of correction signals α and β providing corrected outputs I''' and Q''', in accordance with specifications.

It should be noted that, in constellations where the average power is identical on axes X(t) and Y(t), a gain error between branches can be corrected by arranging automatic gain control circuits before each analog-to-digital converter. On this regard, the present invention has two advantages. On the one hand, both the gain and quadrature errors are corrected. On the other hand, an automatic gain control correction is only usable in the case of constellations where the average power is identical on axes X(t) and Y(t). In more complex systems, such as, for example, Japanese system BS4 where eight different phase states are alternated with a signaling signal of greater amplitude on a single axis, automatic gain control units are inoperative to correct gain errors. In the present invention, gain errors are also corrected for constellations where the average power is not the same on axes X(t) and Y(t).

Figure 5:
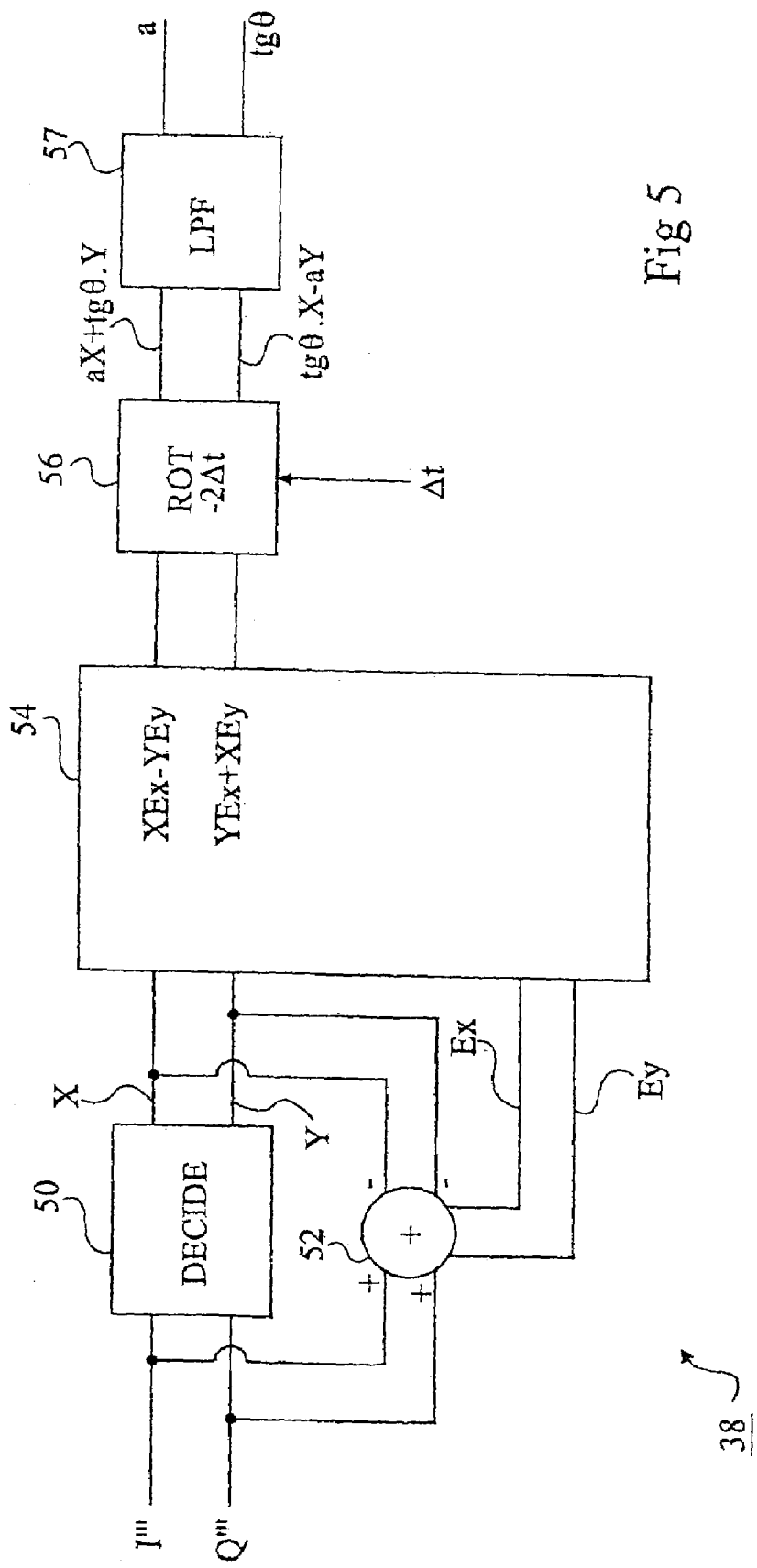
FIG. 5 shows a feedback loop used in a demodulation circuit according to the present invention.

FIG. 5 shows an example of a feedback loop 38. The provided structure is based on the following mathematical considerations.

It has been seen that signals I'a and Q'a at the demodulator output have the following expressions:

$$I'a = (1+a).[X\cos(\Delta t - \theta) - Y\sin(\Delta t - \theta)] \quad (3)$$

$$Q'a = (1-a).[X\sin(\Delta t + \theta) + Y\cos(\Delta t + \theta)] \quad (4)$$

It is first assumed that signals α and β are zero. Output signals I'' and Q'' of unit 36 are then respectively equal to signals I' and Q', that is, to signals I'a and Q'a once digitized. Assuming that the analog-to-digital conversion and the derotation, of angle −Δt, introduce no error:

$$I''' = I'a.\cos(\Delta t) + Q'a.\sin(\Delta t) \quad (5)$$

$$Q''' = -I'a.\sin(\Delta t) + Q'a.\cos(\Delta t) \quad (6)$$

After replacing I'a and Q'a with their values (relations 3 and 4) and dividing by cos θ, one has:

$$I'''/\cos\theta = X[1 + a\cos(2\Delta t) + tg\theta.\sin(2\Delta t)] + Y[tg\theta.\cos(2\Delta t) - a\sin(2\Delta t) + atg\theta] \quad (7)$$

$$Q'''/\cos\theta = X[tg\theta.\cos(2\Delta t) - a\sin(2\Delta t) - atg\theta] + Y[1 - a\cos(2\Delta t) - tg\theta.\sin(2\Delta t)] \quad (8)$$

Term cos θ intervenes as the common gain factor on both paths and its value is close to 1. It can either be subsequently corrected by a gain system which follows, after filtering, the derotator, or be ignored, to have:

$$I'''/\cos\theta \# I''' \quad (7')$$

$$Q'''/\cos\theta \# Q''' \quad (8')$$

By combining relations (7), (7'), and (8), (8'), one can write:

$$I''' = X + Ex \quad (7'')$$

$$Q''' = Y + Ey \text{ with} \quad (8'')$$

$$Ex = (aX + tg\theta.Y).\cos(2\Delta t) + (tg\theta.X - aY).\sin(2\Delta t) + aYtg\theta \quad (9)$$

$$Ey = -(aX + tg\theta.Y).\sin(2\Delta t) + (tg\theta.X - aY).\cos(2\Delta t) - aXtg\theta \quad (10)$$

The values of I''' and Q''' at the output of circuit 20 thus appear, for correction values α and β equal to 0, as exhibiting the searched values, X and Y, added to terms Ex and Ey. Terms Ex and Ey can be interpreted as corresponding to an error vector E of components Ex and Ey depending on the considered point in the constellation.

In the expressions of Ex or Ey, the last term, respectively aYtgθ and aXtgθ, is a second order term. Even with two decibels of gain difference between branches and 10% of quadrature error, the contribution of this term is smaller than 3% of X or Y, and this term can be neglected.

In this case, the components of error Ex and Ey appear as the components of a vector of components E'x=aX+tgθ.Y and E'y=tgθ.X−aY after a rotation of angle −2Δt. Parameters a and tgθ can thus be deduced from components Ex and Ey of the error. Signals α and β enabling correction of the values of I' and Q' can be equal or deduced from parameters a and tgθ. When control loop 38 is stabilized, the output of circuit 20 provides non-erroneous signals I''' and Q''', respectively equal to X(t) and Y(t).

In FIG. 5, the shown circuit enables determining errors a and tgθ from the values of output signals I''' and Q'''. Signals I''' and Q''' are provided to a decision unit 50, as well as to an adder 52. Decision unit 50 operates as follows. For each value of couple (I''', Q'''), unit 50 searches, among the possible values of (X,Y), the most probable value corresponding to (I''',Q'''). For example, in 4-QAM, unit 50 may choose for X the value closest to I'''.

By means of values I''' and X, adder 52 calculates a value Ex=I'''−X. Value Ex represents the error exhibited by signal I'''. Similarly, by means of values Q''' and Y, adder 52 calculates difference Ey=Q'''−Y and provides a value Ey representing the error on Q'''.

Values X, Y, Ex, and Ey are provided to a calculation unit 54 which provides, on its two outputs, signals respectively equal to XEx−YEy and YEx+XEy. The signals provided by calculation unit 54 are sent to a rotator 56 of angle −2(Δt). Rotator 56 sends its output to a filtering unit 57. Based on the received values, unit 57 calculates and provides values proportional to a and tgθ, corresponding to the gain and quadrature errors.

Unit 57 may be followed by a shaping unit providing signals α and β intended to correct signals I' and Q', or the circuit of FIG. 4 is adapted to enable correction of signals I' and Q' directly from the values of a and tgθ. An embodiment thereof will be described in relation with FIG. 6.

Figure 6:
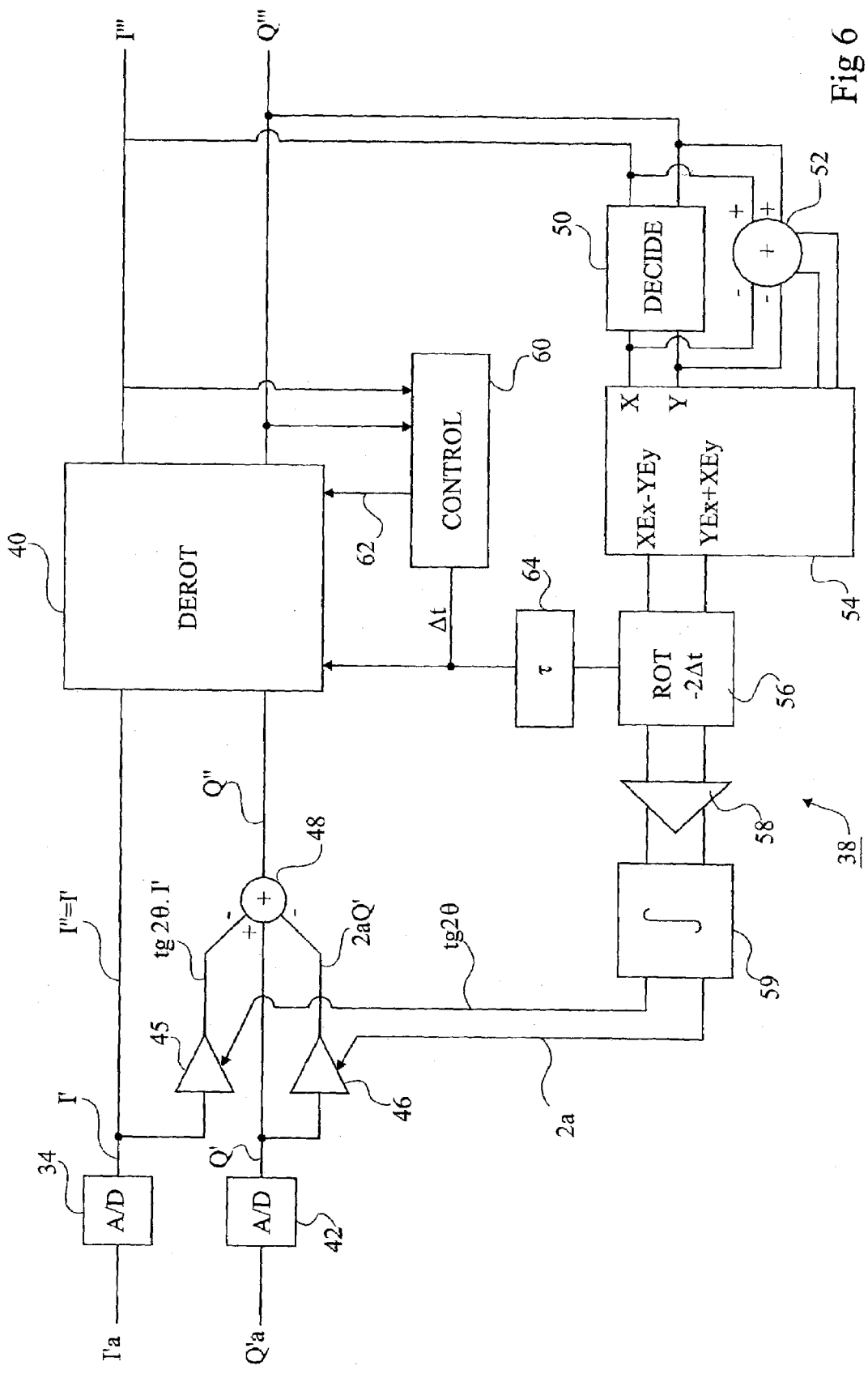
FIG. 6 illustrates an embodiment of a demodulation circuit according to the present invention.

FIG. 6 shows an embodiment of the digital portion of the circuit of the present invention. In FIG. 6, the elements corresponding to the elements of FIGS. 4 and 5 bear the same reference numerals and will not be further detailed. In FIG. 6, signals I'a and Q'a respectively reach analog-to-digital converters 34 and 42. After conversion, signals I'a and Q'a correspond to digital samples I' and Q'. In the example of embodiment of FIG. 6, only the branch in quadrature is corrected.

Indeed, it is also possible to consider that a branch is free of error and that the other branch bears all the error. This corresponds to the following mathematical development, in which relations (1) and (2) become the following relations (11) and (12):

$$I=S(t) \cdot \cos(\omega' t) \quad (11)$$

$$Q=-S(t) \cdot (1+2a) \cdot \sin(\omega' t - 2\theta) \quad (12)$$

One can deduce from relation (12):

$$Q=-S(t) \cdot (1+2a) \cdot \cos(2\theta) \cdot \sin(\omega' t) + S(t) \cdot (1+2a) \cdot \sin(2\theta) \cdot \cos(\omega' t) \quad (13)$$

that is, by means of relation (11):

$$Q=-S(t) \cdot (1+2a) \cdot \cos(2\theta) \cdot \sin(\omega' t) + I \cdot (1+2a) \cdot \sin(2\theta) \quad (14)$$

Relation (14) enables deducing that the correction can be performed on the branch in quadrature only, using, instead of value Q' provided by analog-to-digital converter 42, a corrected value Q'' of expression:

$$Q''=K_1 \cdot Q' - K_2 \cdot I' \quad (15)$$

with $K_1=1/[(1+2a)\cos 2\theta] \approx 1-2a$
and $K_2=\text{tg}2\theta$.

In FIG. 6, feedback loop 38 provides estimations of tg2θ and 2a. These values control the gain of two variable-gain multipliers (or attenuators) 45 and 46. Multiplier 45 receives signal I' from the output of analog-to-digital converter 34 and provides a signal equal to tg2θ.I'. Multiplier 46 receives component Q' from the output of analog-to-digital converter 42 and provides a signal equal to Q'.2a. An adder 48, receiving the outputs of analog-to-digital converter 42, of multiplier 45, and of multiplier 46, provides a signal Q'' equal to the result of operation Q'−2a.Q'−tg2θ.I'. Signals I' and Q'' are sent to a derotator 40, which provides corrected values I''' and Q'''. Derotator 40 may be followed by other elements not shown, such as filters, directors, controlled-gain amplifiers, etc., corrected values I''' and Q''' then corresponding to the output signals of the elements following the derotator. When feedback loop 38 is stable and the derotator angle is correct, the values of I''' and Q''' correspond to values X(t) and Y(t) of the transmitted signal.

Feedback loop 38 comprises a decision unit 50 supplied by outputs I''' and Q''' of the circuit, an adder 52 and a calculation unit 54, of same functions as those described in relation with FIG. 5. The two outputs of calculation unit 54 are sent to a rotator 56 of angle −2Δt. Rotator 56 receives parameter Δt from a control unit 60 which receives components I''' and Q''' of the circuit and provides derotator 40 and rotator 56 with angle Δt enabling performing the rotation and derotation. Control unit 60 conventionally elaborates angle Δt from components I''' and Q'''. Via a connection 62, the control unit provides other control signals to derotator 40. Between the output of control unit 60 and rotator 56, is a delay unit 64 introducing a delay τ intended to compensate for the various processing times of derotator 40 and of units 50, 52, and 54. At the output of rotator 56 is an amplifier 58 which amplifies the two input signals provided thereto, to adjust the control speed. To unit 58 is connected a group of integrators 59 which integrate the signals provided by amplifier 58 and provide coefficients tg2θ and 2a smoothed over time enabling control of variable-gain multipliers 45 and 46.

At the beginning of a demodulation, the errors may be significant. When the loop is stabilized, results I''' and Q''' are error-free, both the gain error and the quadrature error being corrected.

Of course, the present invention is likely to have various alterations, modifications, and improvements which will readily occur to those skilled in the art. In particular, other mathematical developments of expressions I and Q can lead to other embodiments of the present invention. For example, the structure of the feedback loop may be different.

Of course, the performed correction may be performed on the two branches. Adder 48 of FIG. 6 may only include two inputs coupled to the outputs of multipliers 45 and 46, multiplier 46 multiplying signal Q' directly by a coefficient equal to 1−2a. Units 57, 58, and 59 may easily be eliminated and/or replaced with other appropriate units.

It should be noted that the present invention applies to any modulation system where carriers in quadrature coexist, such as modulations of n-QAM, M-PSK, BS4, etc. type.

It should be noted that the present invention also applies by extension to single-carrier modulation systems where the processing is performed on two carriers in quadrature. For example, the present invention also applies to the VSB system, which can be considered as a QAM system where one of the components is delayed.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A demodulation circuit for demodulating a received signal comprising carriers in quadrature modulated by digital signals and/or two carriers in quadrature, the demodulation circuit comprising:

a demodulator for demodulating the received carriers in quadrature and providing first signals substantially in baseband, an analog-to-digital converting means coupled to the demodulator for providing second signals based on the first signals, a correcting circuit for correcting quadrature and gain error between the second signals coupled to the analog-to-digital converter for providing third signals, and a derotator coupled to the correcting circuit for providing output signals based on the third signals, the correcting circuit providing the third signals based on the second signals and on the output signals;

a decision unit receiving the output signals and providing fourth signals assumed to correspond to non-erroneous output signals, a first adder receiving the output signals and the fourth signals and providing fifth signals corresponding to the differences between output signals and the fourth signals, a first calculation unit coupled to the decision unit and to the first adder and providing a linear combination of the fourth and fifth signals, and a rotation unit for rotating the signals provided by the first calculation unit.

2. The circuit of claim 1, wherein the correcting circuit comprises an amplifier coupled with the rotation unit and an integrator coupled with the amplifier.

3. The circuit of claim 1, wherein the second signals comprise a first second signal and a second second signal, and the correcting circuit comprises:

a first multiplier receiving the first second signal and providing a value proportional to the first second signal, a second multiplier receiving the second second signal and providing a value proportional to the second second signal, and a second adder providing a corrected second second signal equal to the difference of the second second signal and of said value proportional to the first second signal, decreased by said value proportional to the second second signal.

4. The circuit of claim 1, comprising a control unit coupled to the derotator for providing a rotation angle to the derotator.

5. The circuit of claim 4, comprising a delay unit coupled to the control unit and to the rotation unit for delaying the rotation angle provided by the control unit.

6. A demodulation circuit for demodulating a received signal comprising carriers in quadrature modulated by digital signals and/or two carriers in quadrature, the demodulation circuit comprising:

a demodulator for demodulating the received carriers in quadrature and providing first signals substantially in baseband, an analog-to-digital converting means coupled to the demodulator for providing second signals based on the first signals, wherein the second signals comprise a first second signal and a second second signal a correcting circuit for correcting quadrature and gain error between the second signals coupled to the analog-to-digital converter for providing third signals, the correcting circuit comprising:

a first multiplier receiving the first second signal and providing a value proportional to the first second signal, a second multiplier receiving the second second signal and providing a value proportional to the second second signal, and a second adder providing a corrected second second signal equal to the difference of the second second signal and of said value proportional to the first second signal, decreased by said value proportional to the second second signal; and a derotator coupled to the correcting circuit for providing output signals based on the third signals, the correcting circuit providing the third signals based on the second signals and on the output signals.

7. The demodulation circuit of claim 6, further comprising:

a control unit coupled to the derotator for providing a rotation angle to the derotator.

8. The demodulation circuit of claim 7, comprising a delay unit coupled to the control unit and to the rotation unit for delaying the rotation angle provided by the control unit.

9. The demodulation circuit of claim 6, wherein the demodulator, analog-to-digital converter and correcting circuit are included in a same integrated circuit.

* * * * *